US009759778B2

(12) United States Patent
Nagato

(10) Patent No.: US 9,759,778 B2
(45) Date of Patent: Sep. 12, 2017

(54) SEMICONDUCTOR DEVICE, BATTERY PACK, AND MOBILE TERMINAL INCLUDING VOLTAGE MEASUREMENT, CURRENT MEASUREMENT, AND CONTROL

(71) Applicant: Renesas Electronics Corporation, Kawasaki-shi (JP)

(72) Inventor: Hidekazu Nagato, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 160 days.

(21) Appl. No.: 14/508,596

(22) Filed: Oct. 7, 2014

(65) Prior Publication Data

US 2015/0134981 A1    May 14, 2015

(30) Foreign Application Priority Data

Nov. 14, 2013 (JP) ................. 2013-235855

(51) Int. Cl.
*G06F 9/00* (2006.01)
*G01R 31/36* (2006.01)
*G06F 1/26* (2006.01)

(52) U.S. Cl.
CPC .......... *G01R 31/3624* (2013.01); *G06F 1/26* (2013.01); *G01R 31/3658* (2013.01)

(58) Field of Classification Search
CPC .... G01R 31/3624; G01R 31/3658; G06F 1/26
USPC ....... 320/125, 128, 107, 136, 132, 130, 116; 307/18; 713/340; 702/63
See application file for complete search history.

(56) References Cited

U.S. PATENT DOCUMENTS

| 6,191,558 B1* | 2/2001 | Arai | H02J 7/0021 |
| | | | 320/130 |
| 7,456,613 B2* | 11/2008 | Uesaka | G01R 31/3624 |
| | | | 320/132 |
| 7,656,164 B2* | 2/2010 | Kawamura | G01R 31/362 |
| | | | 320/116 |
| 2002/0036481 A1* | 3/2002 | Nagase | G01R 31/3624 |
| | | | 320/132 |

(Continued)

FOREIGN PATENT DOCUMENTS

| JP | 2001-51029 A | 2/2001 |
| JP | 2003-79059 A | 3/2003 |
| JP | 2010-34016 A | 2/2010 |

*Primary Examiner* — Aurel Prifti
(74) *Attorney, Agent, or Firm* — McGinn IP Law Group, PLLC

(57) ABSTRACT

A semiconductor device includes a voltage measurement unit that measures an output voltage of a battery and a voltage on a power supply path between the battery and an internal circuit supplied with electric power from the battery, a current measurement unit that measures a discharge current of the battery, and a control unit that calculates a theoretical value of the output voltage in a normal measurement mode assuming that the discharge current measured in a large current measurement mode is a maximum available current of the battery in the large current measurement mode, and calculates an amount of maximum available power of the battery in the large current measurement mode based on the calculated theoretical value of the output voltage and the voltage on the power supply path measured in the large current measurement mode.

18 Claims, 11 Drawing Sheets

(56) References Cited

U.S. PATENT DOCUMENTS

| | | | |
|---|---|---|---|
| 2003/0122524 A1* | 7/2003 | Rhee | H02J 7/0063 320/128 |
| 2003/0169017 A1* | 9/2003 | Ariga | H02J 7/0073 320/125 |
| 2003/0169020 A1* | 9/2003 | Malcolm | G01R 19/0092 320/136 |
| 2005/0269991 A1* | 12/2005 | Mitsui | G01R 31/3624 320/132 |
| 2010/0026092 A1* | 2/2010 | Iida | H01M 10/44 307/18 |
| 2013/0221907 A1* | 8/2013 | Suzuki | H01M 10/443 320/107 |
| 2014/0009164 A1* | 1/2014 | Suzuki | G01R 31/3624 324/430 |
| 2015/0025825 A1* | 1/2015 | Yoshida | G01R 31/3624 702/63 |
| 2015/0058654 A1* | 2/2015 | Ukai | G01R 31/3693 713/340 |
| 2015/0132624 A1* | 5/2015 | Nagato | H01M 10/482 429/92 |

* cited by examiner

SEMICONDUCTOR DEVICE, BATTERY PACK, AND MOBILE TERMINAL INCLUDING VOLTAGE MEASUREMENT, CURRENT MEASUREMENT, AND CONTROL

CROSS-REFERENCE TO RELATED APPLICATIONS

This application is based upon and claims the benefit of priority from Japanese patent application No. 2013-235855, filed on Nov. 14, 2013, the disclosure of which is incorporated herein in its entirety by reference.

BACKGROUND

The present invention relates to a semiconductor device, a battery pack, and a mobile terminal.

Among the CPUs (Central Processing Units) in internal circuits installed in mobile terminals, such as laptop computers, there is a type of CPU that has a variable frequency function in order to keep a balance among the power consumption, the calculation performance, and the reliability (life span). The term "variable frequency function" refers to a function in which in the normal operation state, the clock frequency of the CPU is lowered (normal clock operation) to thereby suppress an increase in power consumption, while the CPU is maintained at a low temperature to thereby suppress deterioration in reliability, and when the number of resource requests from the application(s) increases, the clock frequency of the CPU is raised (high-speed clock operation) to thereby improve the calculation performance.

When the CPU is driven by electric power supplied from a battery (an assembled battery in which a plurality of secondary battery cells are combined), the high-speed clock operation period and the clock frequency in the high-speed clock operation state is determined based on the amount of available power of the battery. For example, the CPU is configured to be able to select a plurality of clock frequencies, which are higher than the clock frequency in the normal clock operation state, as the clock frequency in the high-speed clock operation state. Based on the amount of available power of the battery at that time, an optimum clock frequency is selected.

On the other hand, the state of a battery installed in a mobile terminal, such as a laptop computer, is monitored by a battery monitoring system installed in a battery pack together with the battery. The battery monitoring system generally includes a battery control IC (FGIC: Fuel Gauge IC), a sense resistor for detecting charge and discharge currents of the battery as voltage information, a charge control MOS transistor, a discharge control MOS transistor, and a protection circuit such as a thermistor or a fuse. The battery control IC includes, for example, a microcontroller, and implements a function of managing a remaining battery level, a function of controlling charge control/discharge control MOS transistors, a battery protection function, and the like. For example, the battery control IC generates information indicating the state of the battery based on the detection results of the charge and discharge currents and battery voltage of the battery, and notifies the internal circuit in the mobile terminal about the generated information. Examples of the information indicating the state of the battery include a full charge capacity (FCC), a battery remaining capacity (RC), and a state of charge (SOC) of the battery. Japanese Unexamined Patent Application Publication Nos. 2010-34016, 2003-79059, and 2001-51029 disclose related art.

The battery control IC generates not only the information indicating the state of the battery, but also information about a maximum power amount, which is the amount of maximum power that can be supplied to the internal circuit from the battery, based on the measurement results of the discharge current and battery voltage of the battery. A notification regarding the information about the maximum power amount is transmitted, as needed (for example, once per second), to the PC system (internal circuit) of the laptop computer, and is used to determine the high-speed clock operation period and the clock frequency in the high-speed clock operation state.

SUMMARY

More accurate information about the maximum power amount is required for the CPU having the variable frequency function to perform the high-speed clock operation at an appropriate clock frequency and in an appropriate period. The maximum power amount is calculated based on, for example, a minimum operating voltage and a maximum available current of the battery within the range in which a power supply voltage applied to the PC system is not less than the minimum operating voltage that ensures the operation of the PC system.

In general, if the discharge current of a battery varies upon switching of the operation mode, the internal resistance of the battery varies, so that the output voltage of the battery also varies. Accordingly, the power supply voltage applied to the PC system also varies. For this reason, in order to obtain the maximum power amount with a high accuracy, it is necessary to measure the discharge current and battery voltage of the battery in each clock operation mode, estimate the internal resistance of the battery based on the measurement results, and thereby calculate the maximum power amount.

Further, the battery control IC is required to calculate the maximum power amount with a high accuracy even when resistance components on the power supply path between the battery and the PC system vary due to a voltage change, a temperature change, or the like. The measurement of a large current and battery voltage unexpectedly generated for a short period of time is not considered at all in the configurations disclosed in Japanese Unexamined Patent Application Publication Nos. 2010-34016, 2003-79059, and 2001-51029. Other problems to be solved and novel features of the invention will become apparent from the description of this specification and the accompanying drawings.

A first aspect of the present invention is a semiconductor device including a control unit that calculates a theoretical value of an output voltage of a battery in a normal measurement mode assuming that a discharge current of the battery measured in a large current measurement mode is a maximum available current of the battery in the large current measurement mode, and calculates an amount of maximum available power of the battery in the large current measurement mode based on the calculated theoretical value of the output voltage and a voltage on a power supply path measured in the large current measurement mode.

According to the aspect, it is possible to provide a semiconductor device, a battery pack, and a mobile terminal, which are capable of calculating the amount of maximum available power of the battery with a high accuracy.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
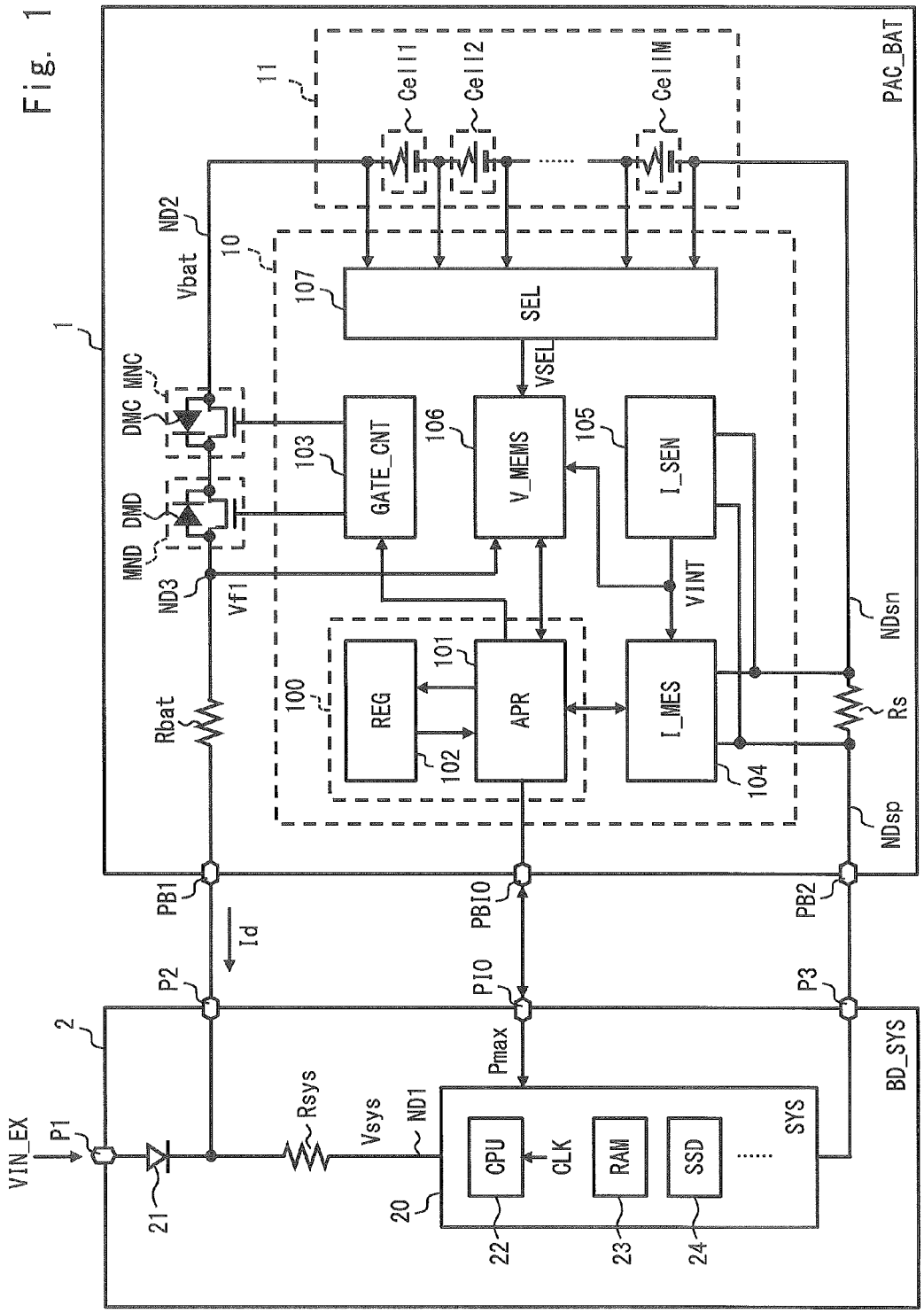
FIG. 1 is a block diagram showing a mobile terminal equipped with a battery pack including a battery control IC according to a first embodiment.

Embodiments will be described below with reference to the drawings. It should be noted that the drawings are made in a simplified manner, and therefore the technical scope of the embodiments should not be narrowly interpreted based on those drawings. The same components are denoted by the same reference numerals, and thus a duplicated explanation thereof is omitted.

In the following embodiments, when necessary, the present invention is explained by using separate sections or separate embodiments. However, those embodiments are not unrelated to each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, etc.) is mentioned, the number is not limited to that specific number except for cases where the number is explicitly specified or the number is obviously limited to a specific number based on its principle. That is, a larger number or a smaller number than the specific number may also be used.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationship, or the like of the constituent elements are mentioned, they include substantially similar or analogous shapes and so forth, except for the case where it is explicitly indicated or it is theoretically clear that the above is not true. This also applies to the above-mentioned values (including numbers, values, quantities, ranges, etc.) and the like.

<First Embodiment>

FIG. 1 is a block diagram showing a mobile terminal equipped with a battery pack including a battery control IC (semiconductor device) according to a first embodiment.

A mobile terminal 200 shown in FIG. 1 includes a system board (BD_SYS) 2 and a battery pack (PAC_BAT) 1. The mobile terminal 200 is, for example, a laptop computer.

The system board 2 includes an internal circuit (SYS) 20, which implements functions of the mobile terminal such as a laptop computer, and a plurality of external terminals. FIG. 1 illustrates an external power supply terminal P1, a high-potential-side power supply terminal P2, a low-potential-side power supply terminal P3, and an input/output terminal PIO as typical examples of the plurality of external terminals of the system board 2. The external power supply terminal P1 is supplied with external electric power from an external power supply (for example, an AC adaptor) VIN_EX. The high-potential-side power supply terminal P2 and the low-potential-side power supply terminal P3 are each connected to the battery pack 1. The input/output terminal PIO is used to communicate with the battery pack 1. These components constituting the system board 2 are formed on a mounting board such as a printed circuit board.

The internal circuit 20 is driven by electric power supplied from the battery pack 1 through the high-potential-side power supply terminal P2 and the low-potential-side power supply terminal P3. A signal line that connects the high-potential-side power supply terminal P2 and the internal circuit 20 to each other includes a parasitic resistance component such as a wiring resistance and a contact resistance of external terminals (hereinafter referred to as a parasitic resistance Rsys). When the external power supply VIN_EX is connected to the external power supply terminal P1, the internal circuit 20 is driven by both the external electric power, which is supplied from the external power supply VIN_EX through a diode 21, and the electric power supplied from the battery pack 1. This is because in order to achieve a reduction in weight, power consumption, and cost, the maximum power of the external power supply VIN_EX is designed to be smaller than the maximum power that is required during a high-speed clock operation. The external electric power supplied from the external power supply VIN_EX is supplied not only to the internal circuit 20, but also to the battery pack 1 as needed and used for charging of an assembled battery 11.

The internal circuit 20 is composed of a plurality of semiconductor components, such as a CPU (including a GPU) 22, a large-capacity RAM (Random Access Memory) 23, and an SSD (Solid State Drive) 24.

The CPU 22 has the above-mentioned variable frequency function. That is, the CPU 22 is configured to be switchable between a normal clock operation mode in which the CPU 22 operates at a clock frequency f1 and a high-speed clock operation mode in which the CPU 22 operates at a clock frequency f2 which is higher than the clock frequency f1. For example, the internal circuit 20 sets the normal clock operation mode in the normal operation state, to thereby suppress an increase in power consumption, and maintains the CPU 22 at a low temperature, to thereby suppress deterioration in reliability. On the other hand, when the number of resource requests from the application(s) increases, the internal circuit 20 sets the high-speed clock operation mode, to thereby improve the calculation performance. However, if the clock frequency is maintained at a high frequency for a long time, the power consumption and the chip temperature of the CPU 22 increase, resulting in the deterioration of the reliability. Therefore, the period during which the clock frequency is maintained at a high frequency is limited to a short period of, for example, about 10 ms. In order to cause the CPU 22 to continuously operate in the high-speed clock operation mode, the control is performed in the following manner. That is, the operation mode is temporarily returned to the normal clock operation mode after a lapse of an operation period of 10 ms in the high-speed clock operation mode, and the operation mode is shifted to the high-speed clock operation mode again after it is confirmed that the chip temperature of the CPU 22 has decreased to a temperature within a safe range.

The period during which the CPU 22 operates in the high-speed clock operation mode and the clock frequency f2 used in the high-speed clock operation mode are determined based on a maximum power amount Pmax, which is the amount of maximum power that can be supplied to the internal circuit 20 from the assembled battery 11. For example, the CPU 22 is configured to be able to select, as the clock frequency f2 used in the high-speed clock operation mode, a plurality of clock frequencies f2_1 to f2_n (n is an integer equal to or greater than 2) which are higher than the clock frequency f1 used in the normal clock operation mode. When the operation mode is shifted to the high-speed clock operation mode, an appropriate clock frequency is selected from among the clock frequencies f2_1 to f2_n based on the maximum power amount Pmax regarding which a notification has been sent from the battery pack 1, and a clock signal CLK having the selected clock frequency is supplied to the CPU 22. For example, when the maximum power amount Pmax is large, a higher clock frequency is selected, and when the maximum power amount Pmax is small, a lower clock frequency is selected. The maximum power amount Pmax will be described in detail later.

The battery pack 1 includes the assembled battery (battery) 11, a battery control IC 10, a charge control transistor MNC, a discharge control transistor MND, a sense resistor Rs, and a plurality of external terminals. FIG. 1 shows, as typical examples of the plurality of external terminals of the battery pack 1, a high-potential-side power supply terminal PB1 and a low-potential-side power supply terminal PB2 of the assembled battery 11, and an input/output terminal PBIO used to communicate with the system board 2.

The high-potential-side power supply terminal PB1 and the low-potential-side power supply terminal PB2 are terminals that electrically connect the assembled battery 11 to an external device (the internal circuit 20 on the system board 2). The high-potential-side power supply terminal PB1 is connected to the high-potential-side power supply terminal P2 on the system board 2, and the low-potential-side power supply terminal PB2 is connected to the low-potential-side power supply terminal P3 on the system board 2.

The assembled battery 11 is provided between the high-potential-side power supply terminal PB1 and the low-potential-side power supply terminal PB2. In the assembled battery 11, for example, a plurality of unit battery cells Cell1 to CellM (M is an integer equal to or greater than 2), which are chargeable and dischargeable unit battery cells, are connected in series. Although not particularly limited, the unit battery cells Cell1 to CellM are lithium ion secondary batteries. The voltage of the assembled battery 11 can be increased by increasing the number of unit battery cells to be connected in series. Further, the capacity of the assembled battery 11 can be increased by connecting a plurality of groups of series-connected unit battery cells in parallel. The assembled battery 11 is composed of a plurality of unit battery cells in the example shown in FIG. 1. However, if the power consumption in the system board 2 is small, the assembled battery 11 may be composed of only one unit battery cell. The assembled battery 11 generates an output voltage Vbat at a positive-side electrode (node ND2).

Turning on and off of the charge control transistor MNC and the discharge control transistor MND is controlled based on a control signal output from the battery control IC 10. The charge control transistor MNC and the discharge control transistor MND are transistors capable of outputting a large current. The charge control transistor MNC and the discharge control transistor MND are, for example, IGBTs or power MOS transistors. In the example shown in FIG. 1, the charge control transistor MNC and the discharge control transistor MND are each composed of an N-channel type power MOS transistor. The charge control transistor MNC and the discharge control transistor MND are provided in series between the high-potential-side power supply terminal PB1 and the node ND2 in such a manner that the drain electrodes (cathode side of a body diode) of the transistors are opposed to each other. The charge control transistor MNC and the discharge control transistor MND enable electrical connection and disconnection between the assembled battery 11 and the external device (system board 2). For example, the assembled battery 11 can be charged by turning on the charge control transistor MNC. At this time, the discharge control transistor may be in the on state or in the off state. When the discharge control transistor MND is in the off state, a charge current is supplied from the external power supply VIN_EX to the assembled battery 11 through the diode 21 of the system board 2, a body diode DMD of the discharge control transistor MND, and the charge control transistor MNC. The assembled battery 11 can be discharged by turning on the discharge control transistor MND. At this time, the charge control transistor MNC may be in the on state or in the off state. When the charge control transistor MNC is in the off state, a discharge current Id is supplied from the assembled battery 11 to the internal circuit 20 through a body diode DMC of the charge control transistor MNC and the discharge control transistor MND.

A signal line that connects the high-potential-side power supply terminal PB1 of the battery pack 1 and the positive-side electrode (node ND2) of the assembled battery 11 to each other includes a parasitic resistance component such as a wiring resistance and a contact resistance of external terminals (hereinafter referred to as a parasitic resistance Rbat).

The sense resistor Rs detects currents (a charge current and a discharge current) flowing into and out of the assembled battery 11 as a voltage. For example, the sense resistor Rs is provided between the negative-side electrode (node NDsn) of the assembled battery 11 and the low-potential-side power supply terminal PB2 (node NDsp) of the battery pack 1. The voltage across both ends of the sense resistor Rs is detected as information about the charge current or the discharge current, and is input to the battery control IC 10.

The battery control IC 10 monitors the state of the assembled battery 11, and controls the execution and suspension of charging and discharging of the assembled battery 11. Although not particularly limited, the battery control IC 10 is a one-chip microcontroller formed on a semiconductor substrate by a known CMOS integrated circuit manufacturing technique.

For example, the battery control IC 10 includes a function of measuring a discharge current value Ia and an output voltage value Va of the assembled battery 11 in the normal clock operation mode, measuring a discharge current value Ib and an output voltage value Vb of the assembled battery 11 in the high-speed clock operation mode, and estimating an internal resistance RCELL of the assembled battery 11 based on the measurement results. Further, the battery control IC 10 includes a function of calculating a maximum current Imax, which can be output to the internal circuit 20 by the assembled battery 11, based on the estimated internal resistance RCELL, and calculating the maximum power amount Pmax based on the maximum current Imax and a minimum operating voltage Vmin. Furthermore, the battery control IC 10 includes a function of calculating, assuming that the discharge current value Ib is the maximum current Imax, a theoretical value Va_set of the output voltage value Va, calculating an actual value Va_real of the output voltage value Va based on the theoretical value Va_set and a voltage Vf1 on a power supply path, and correcting the maximum power amount Pmax based on the actual value Va_real of the output voltage value Va. Additionally, the battery control IC 10 may further include a function of determining the operation mode of the CPU 22 by monitoring the discharge current Id of the assembled battery 11. The configuration of the battery control IC 10 will be described in detail below.

The battery control IC 10 includes a data processing control unit (control unit) 100, a gate control unit (GATE_CNT) 103, a select unit (SEL) 107, a voltage measurement unit (V_MES) 106, a current measurement unit (I_MES), and a mode determination unit (I_SEN) 105.

The select unit 107 selects a voltage to be measured according to an instruction from the data processing control unit 100. For example, the select unit 107 sequentially selects the output voltages of the unit battery cells Cell1 to CellM one by one, and outputs the selected output voltage as a voltage VSEL.

The voltage measurement unit 106 measures the voltage VSEL output from the select unit 107. For example, the voltage measurement unit 106 includes an A/D converter 1061. The A/D converter 1061 converts the voltage VSEL, which is output from the select unit 107, into a digital value in a predetermined cycle (for example, 8 ms), thereby measuring the output voltages of the unit battery cells Cell1 to CellM. The A/D converter 1061 is, for example, a ΔΣ-type A/D conversion circuit.

The voltage measurement unit 106 calculates the output voltage Vbat of the assembled battery 11 based on the measured values of the output voltages of the unit battery cells Cell1 to CellM. For example, the voltage measurement unit 106 adds the output voltages of the unit battery cells Cell1 to CellM, which are connected in series, thereby calculating the output voltage Vbat of the assembled battery 11. The measurement results of the voltage measurement unit 106 are stored in a predetermined register within a register unit 102. To store the data into the register unit 102, the voltage measurement unit 106 may directly access the register unit 102, or may access the register unit 102 via a calculation unit 101.

Further, the voltage measurement unit 106 measures the voltage Vf1 at a node ND3 on the power supply path between the positive-side electrode (node ND2) of the assembled battery 11 and the high-potential-side power supply terminal (node ND1) of the internal circuit 20. More specifically, the voltage measurement unit 106 measures the voltage Vf1 at the node ND3 between the parasitic resistance Rbat and the discharge and charge control transistors MND and MNC. In other words, the voltage measurement unit 106 measures the output voltage Vf1 of each of the discharge control transistor MND and the charge control transistor MNC.

The current measurement unit 104 measures charge and discharge currents of the assembled battery 11. For example, the current measurement unit 104 includes an A/D converter 1041. The A/D converter 1041 measures the charge and discharge currents of the assembled battery 11 by converting the voltage across both ends of the sense resistor Rs into a digital value in the predetermined cycle. The current measurement unit 104 further includes a coulomb counter. The coulomb counter integrates the measured values of the charge current and the discharge current, thereby generating information about the amount of charged and discharged electric charge. The A/D converter 1041 is, for example, a ΔΣ-type A/D conversion circuit. The measurement results of the current measurement unit 104 are stored in a predetermined register within the register unit 102. To store the data in the register unit 102, the voltage measurement unit 104 may directly access the register unit 102, or may access the register unit 102 via the calculation unit 101.

The gate control unit 103 generates a control signal for controlling turning on and off of the charge control transistor MNC and the discharge control transistor MND according to an instruction from the data processing control unit 100. As shown in FIG. 1, the gate control unit 103 may be configured to directly drive the charge control transistor MNC and the discharge control transistor MND. Alternatively, a pre-driver circuit may be provided outside the battery control IC 10, and the pre-driver circuit may be configured to drive the charge control transistor MNC and the discharge control transistor MND based on the control signal output from the gate control unit 103.

The data processing control unit 100 performs a comprehensive control of each function unit in the battery control IC 10, and performs various calculations. The data processing control unit 100 transmits and receives data to and from the internal circuit 20, which is provided in the system board 2, through an external interface circuit (not shown). Specifically, the data processing control unit 100 is implemented by a program processor including at least a CPU which executes the calculations and control according to a program, a non-volatile storage unit (a mask ROM, a flash memory, etc.) which stores the program, and a volatile storage unit (RAM) which stores calculation results and the like.

FIG. 1 shows the calculation unit (APR) 101 and the register unit (REG) 102 as typical examples of the data processing control unit 100. The calculation unit (APR) 101 serves as function implementation means for implementing the calculation function and the control function of the data processing control unit 100. The register unit (REG) 102 includes a plurality of registers which store, for example, programs and calculation results used for the calculations and control. The register unit 102 stores various parameters such as the resistance value of the sense resistor Rs, the resistance values of the parasitic resistances Rsys and Rbat, the on-resistances of the charge control transistor MNC and the discharge control transistor MND, the forward voltages of the body diodes DMC and DMD, and the minimum operating voltage Vmin. As described above, the register unit 102 also stores the measurement results obtained by the voltage measurement unit 106 and the current measurement unit 104.

The calculation unit 101 performs various calculations based on the charge and discharge current values measured by the current measurement unit 104, and the voltages of the unit battery cells Cell1 to CellM measured by the voltage measurement unit 106, thereby generating information indicating the state of the assembled battery 11. Specifically, the calculation unit 101 generates, as the information indicating the state of the assembled battery 11, a full charge capacity FCC, a remaining capacity RC of the assembled battery 11, a state of charge SOC of the assembled battery 11, and the like, and also generates information about the maximum power amount Pmax. The calculation unit 101 transmits the information indicating the state of the assembled battery 11 to the internal circuit 20 within the system board 2 through the input/output terminal PBIO. A timing at which the calculation unit 101 transmits the maximum power amount Pmax to the internal circuit 20 is determined based on a request from the internal circuit 20. For example, the calculation unit 101 transmits the information about the maximum power amount Pmax once per second based on the request from the internal circuit 20. A specific method for calculating the maximum power amount Pmax will be described later.

The mode determination unit 105 determines whether the operation mode of the CPU 22 is the normal clock operation mode or the high-speed clock operation mode. The mode determination unit 105 is, for example, a current detection unit which determines that the operation mode of the CPU 22 is the normal clock operation mode when the discharge current Id is equal to or less than a threshold current Ith, and which determines that the operation mode of the CPU 22 is the high-speed clock operation mode when the discharge current Id is larger than the threshold current Ith. The first embodiment illustrates an example in which the mode determination unit 105 serves as the current detection unit (hereinafter referred to as the current detection unit 105).

(A Specific Configuration Example of the Current Detection Unit 105)

Figure 2:
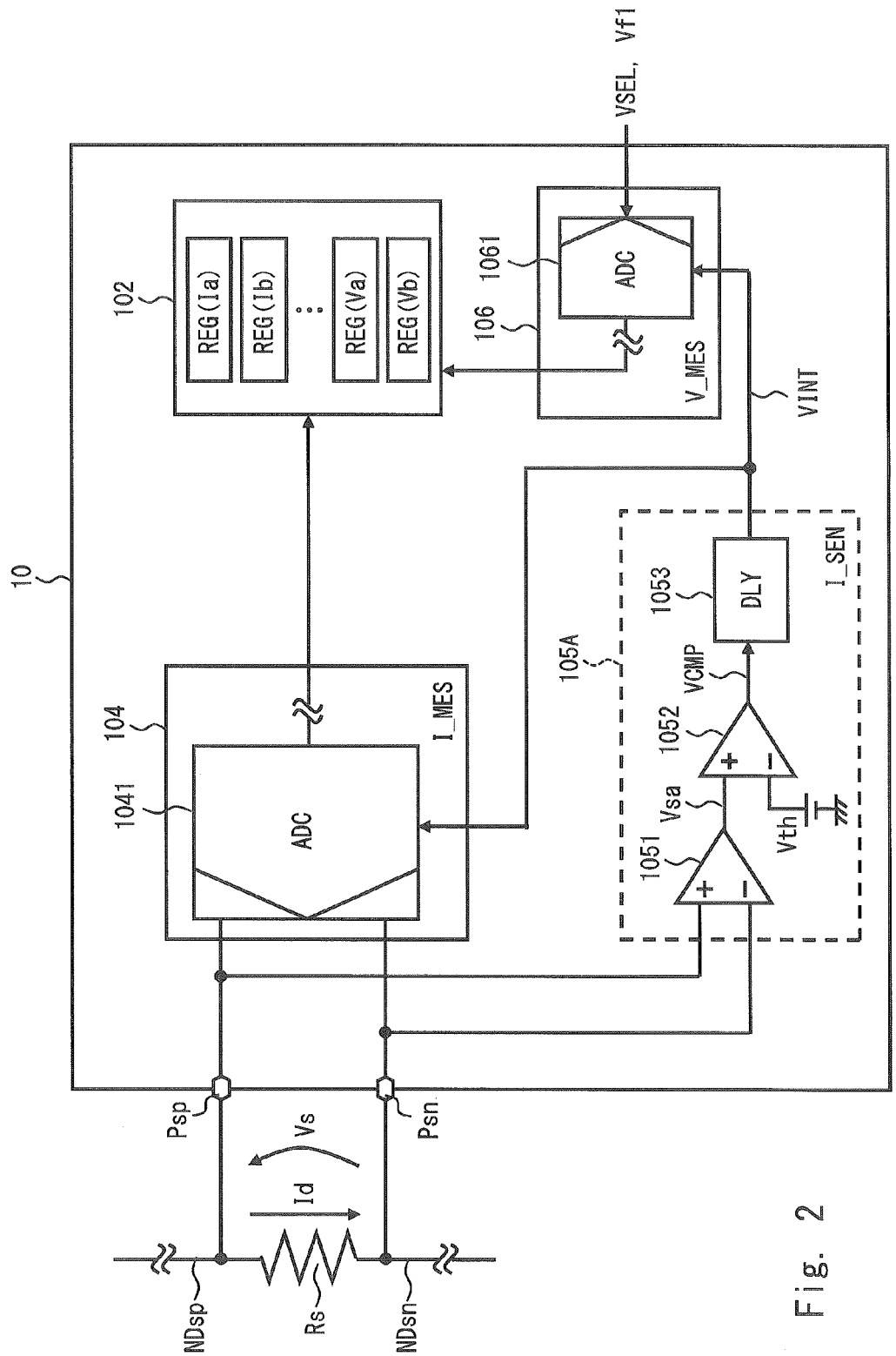
FIG. 2 is a diagram showing a specific configuration example of a current detection unit 105.

FIG. 2 is a diagram showing a current detection unit 105A as a specific configuration example of the current detection unit 105. FIG. 2 also shows the register unit 102, the current measurement unit 104, the voltage measurement unit 106, and the sense resistor Rs.

The current detection unit 105A shown in FIG. 2 includes a differential amplifier (AMP) 1051, a comparator (CMP) 1052, and an output signal generation unit (DLY) 1053.

The differential amplifier 1051 amplifies a detected voltage (voltage across both ends of the sensor resistor Rs) Vs which is input through external terminals Psp and Psn of the battery control IC 10, and outputs the amplified voltage as a voltage Vsa. For example, assuming that the amplification factor of the differential amplifier 1051 is 100, the differential amplifier 1051 amplifies the detected voltage Vs of 1 mV, which is generated by the discharge current Id of 500 mA flowing through the sensor resistor Rs of 2 mΩ, to 100 mV, and outputs the amplified voltage as the voltage Vsa.

The comparator 1052 compares the voltage Vsa, which is output from the differential amplifier 1051, with a threshold voltage Vth corresponding to the threshold current Ith, and outputs a comparison result VCMP. For example, when the voltage Vsa is equal to or less than the threshold voltage Vth, the comparator 1052 sets the signal level of the comparison result VCMP to the low level, and when the voltage Vsa is higher than the threshold voltage Vth, the comparator 1052 sets the signal level of the comparison result VCMP to the high level. The threshold current Ith is a reference value for discriminating whether the CPU 22 of the internal circuit 20 is operating in the high-speed clock operation mode, or is operating in the normal clock operation mode. For example, the threshold current Ith is set to a value which is greater than the expected value of the discharge current obtained when the CPU 22 is operating in the normal clock operation mode and which is smaller than the expected value of the discharge current obtained when the CPU 22 is operating in the high-speed clock operation mode. The threshold voltage Vth is a reference voltage which is set according to the threshold current Ith. The output signal generation unit 1053 generates an interrupt signal VINT when the comparator 1052 detects that the discharge current Id has exceeded the threshold current Ith. For example, when the state in which the discharge current Id exceeds the threshold current Ith continues for a predetermined period TD or longer, the output signal generation unit 1053 generates the interrupt signal VINT.

Figure 3:
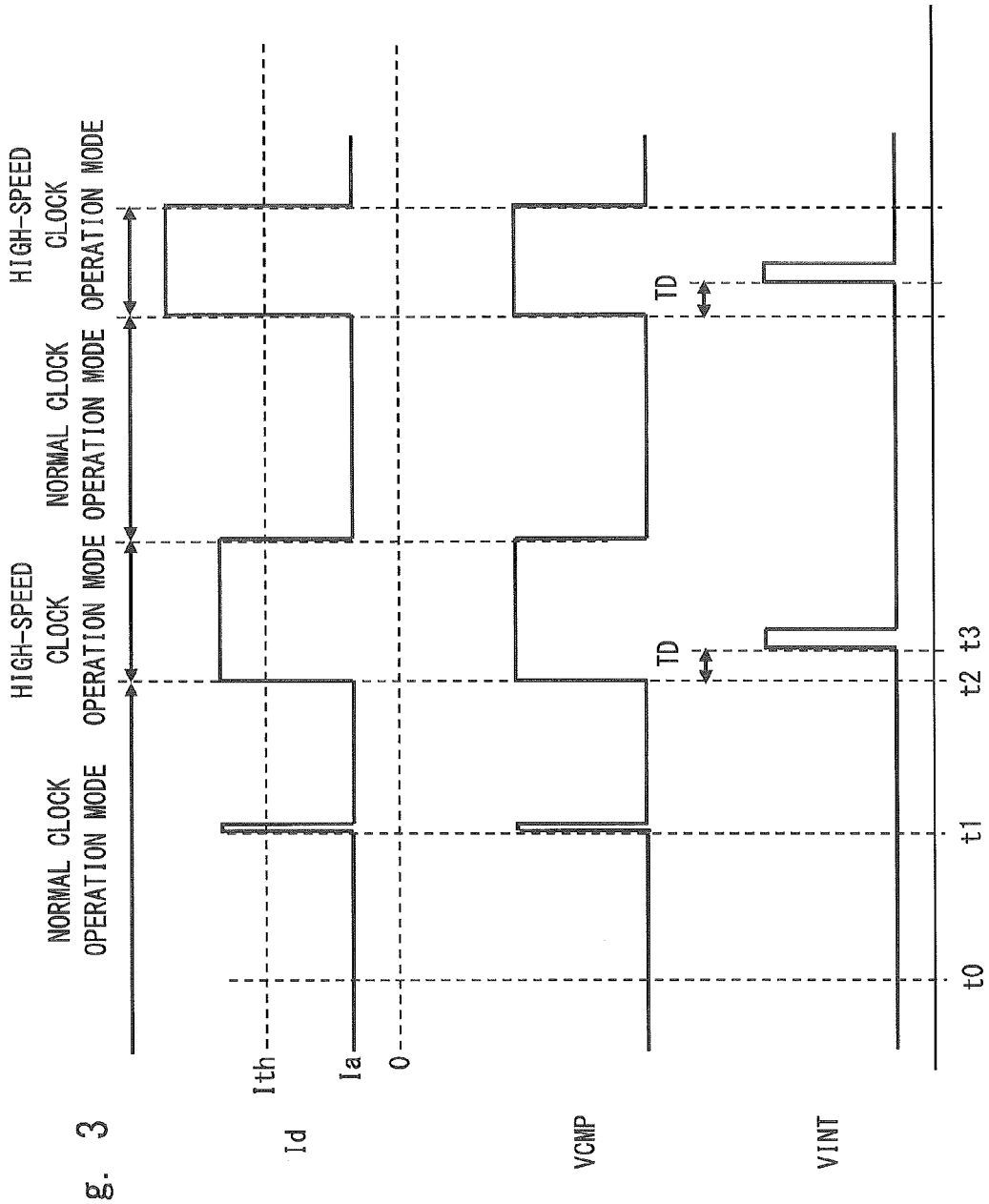
FIG. 3 is a timing chart showing an operation of the current detection unit 105.

FIG. 3 is a timing chart showing an operation of the current detection unit 105A.

First, at time t0, the CPU 22 is operating in the normal clock operation mode. At this time, the discharge current Id indicates the threshold current Ith or less. Also, at this time, the comparison result VCMP of the comparator 1052 indicates the L level. Accordingly, the output signal generation unit 1053 does not generate the interrupt signal VINT.

Next, at time t1, when the discharge current Id momentarily exceeds the threshold current Ith due to the effect of noise or the like, the comparison result VCMP of the comparator 1052 changes from the L level to the H level. However, since the period in which the comparison result VCMP indicates the H level is equal to or less than the predetermined period TD, the output signal generation unit 1053 does not generate the interrupt signal VINT.

Next, at time t2, when the operation mode of the CPU 22 is switched from the normal clock operation mode to the high-speed clock operation mode, the discharge current Id exceeds the threshold current Ith. Accordingly, the comparison result VCMP of the comparator 1052 changes from the L level to the H level again. In this case, since the period in which the comparison result VCMP indicates the H level exceeds the predetermined period TD, the output signal generation unit 1053 generates the interrupt signal VINT at the time (time t3) that the predetermined period TD has elapsed after the comparison result VCMP has changed to the H level. Although not particularly limited, the interrupt signal VINT is a one-shot pulse signal.

In this manner, the current detection unit 105A can easily determine whether the discharge current Id has exceeded the threshold current Ith. The current detection unit 105A generates the interrupt signal VINT only when the state in which the discharge current Id exceeds the threshold current Ith continues for the predetermined period. This prevents erroneous detection of an instantaneous increase in the discharge current due to noise or the like. Further, the current detection unit 105A includes an amplification unit (differential amplifier 1051) provided at the preceding stage of the comparator 1052. This makes it possible to reduce the resistance value of the sense resistor Rs, and thereby reduce a loss generated in the sense resistor Rs.

(Another Specific Configuration Example of the Current Detection Unit 105)

Figure 4:
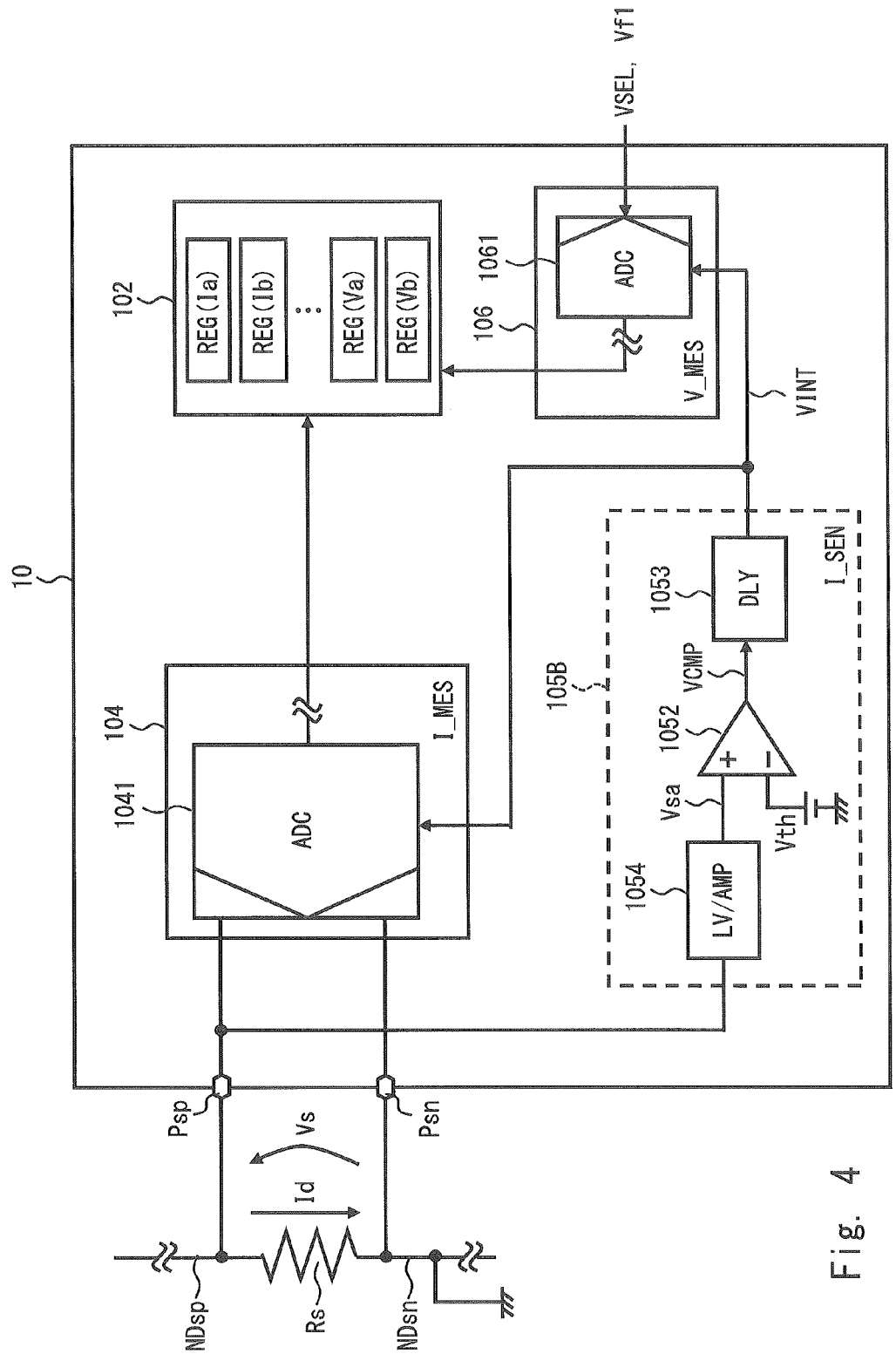
FIG. 4 is a diagram showing another specific configuration example of the current detection unit 105.

FIG. 4 is a diagram showing a current detection unit 105B as another specific configuration example of the current detection unit 105. The current detection unit 105B differs from the current detection unit 105A in that the current detection unit 105B includes a level shifter/gain adjustment circuit (LV/AMP) 1054 instead of the differential amplifier 1051.

In the example shown in FIG. 4, an end (node NDsn) of the sense resistor Rs is grounded. In the current detection unit 105B, the level shifter/gain adjustment circuit 1054 amplifies a voltage at the other end (node NDsp) of the sense resistor Rs, and outputs the amplified voltage as the voltage Vsa. The other components and operation of the current detection unit 105B are similar to those of the current detection unit 105A, and thus the description thereof is omitted. The current detection unit 105B can provide the same effects as those of the current detection unit 105A.

Next, the operation of the voltage measurement unit 106 and the current measurement unit 104 will be described in detail.

When the operation mode of the CPU 22 is the normal clock operation mode (i.e., in the normal operation state), the voltage measurement unit 106 periodically executes the measurement of the output voltages of the unit battery cells Cell1 to CellM and the calculation of the output voltage Vbat of the assembled battery 11. Further, when the operation mode of the CPU 22 is shifted from the normal clock operation mode to the high-speed clock operation mode, the voltage measurement unit 106 executes the measurement of the output voltages of the unit battery cells Cell1 to CellM and the calculation of the output voltage Vbat of the assembled battery 11. In this example, when the interrupt signal VINT is generated, the voltage measurement unit 106 determines that the operation mode of the CPU 22 has shifted to the high-speed clock operation mode, and executes the measurement of the output voltages of the unit battery cells Cell1 to CellM and the calculation of the output voltage Vbat of the assembled battery 11. Further, when the operation mode of the CPU 22 has shifted from the normal clock operation mode to the high-speed clock operation mode, the voltage measurement unit 106 executes the measurement of the voltage (output voltage of each of the transistors MND and MNC) Vf1 at the node ND3 on the power supply path.

As described above, the period in which the CPU 22 operates in the high-speed clock operation mode is a short period of about 10 ms. Accordingly, in some cases, the voltage measurement unit 106 cannot complete the measurement of the output voltages of all the unit battery cells Cell1 to CellM within the period. In this case, the battery control IC 10 selects one unit battery cell indicating a minimum output voltage in the normal clock operation mode, and measures the output voltage of the selected unit battery cell in the high-speed clock operation mode by using the voltage measurement unit 106. Further, the battery control IC 10 treats the value obtained by multiplying the measured value by M (multiplied by the number of unit battery cells connected in series) as the output voltage Vbat of the assembled battery 11 in the high-speed clock operation mode.

In the normal operation state, the current measurement unit 104 periodically executes the measurement of the charge and discharge currents of the assembled battery 11. Also when the operation mode of the CPU 22 has shifted from the normal clock operation mode to the high-speed clock operation mode, the current measurement unit 104 executes the measurement of the charge and discharge currents of the assembled battery 11. In this example, when the interrupt signal VINT is generated, the current measurement unit 104 determines that the operation mode of the CPU 22 has shifted to the high-speed clock operation mode, and executes the measurement of the charge and discharge currents of the assembled battery 11.

As described above, the period in which the CPU 22 operates in the high-speed clock operation mode is a short period of about 10 ms. Accordingly, there is a possibility that the current measurement unit 104 cannot complete the measurement of the charge and discharge currents of the assembled battery 11 within the period. Therefore, the current measurement unit 104 may have a function of temporarily stopping the measurement operation, which has been periodically executed in the normal operation state, when the operation mode of the CPU 22 is shifted to the high-speed clock operation mode (when the interrupt signal VINT is generated), for example, and executing a new current measurement by lowering the resolution of the A/D conversion.

(Method for Calculating the Maximum Power Amount Pmax)

Next, the method for calculating the maximum power amount Pmax by the battery control IC 10 will be described in detail.

As described above, the maximum power amount Pmax is the amount of maximum power that can be supplied to the internal circuit 20 from the assembled battery 11. The maximum power amount Pmax is calculated based on the product of a maximum current that can be supplied from the assembled battery 11 within the range in which a power supply voltage applied to the internal circuit 20 is not less than a minimum operating voltage that ensures the operation of the internal circuit 20, and the minimum operating voltage. This will be described in detail below.

Figure 5:
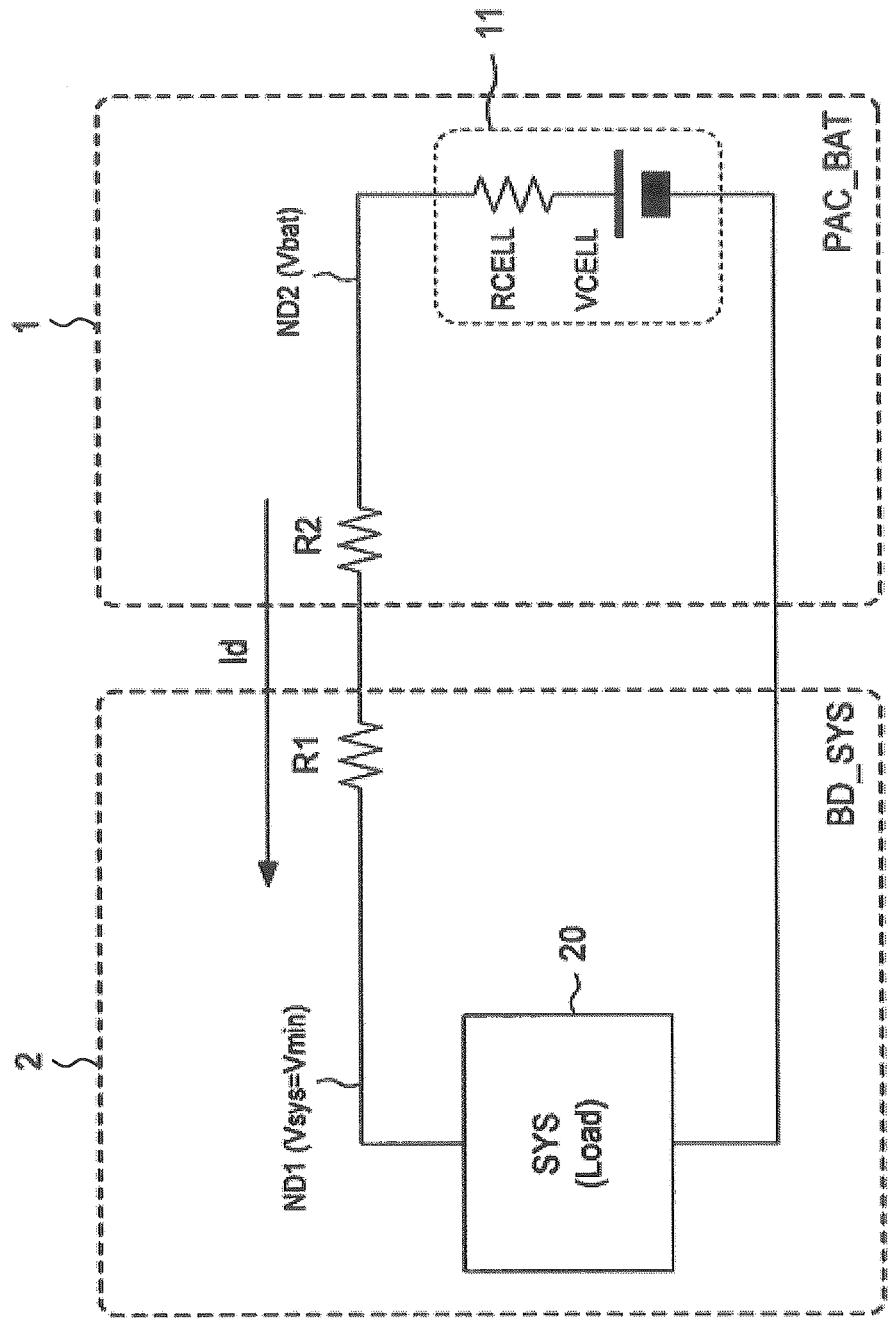
FIG. 5 is a diagram for explaining a method for calculating a maximum power amount Pmax by the battery control IC according to the first embodiment.

FIG. 5 is a diagram for explaining the method for calculating the maximum power amount Pmax. FIG. 5 illustrates the power supply path from the assembled battery 11 to the internal circuit 20 in a simplified manner. In FIG. 5, the plurality of unit battery cells Cell1 to CellM, which constitute the assembled battery 11, are illustrated in a simplified manner and are represented as one unit battery cell. In FIG. 5, VCELL represents the total cell voltage of the unit battery cells Cell1 to CellM; RCELL represents the total internal resistance of the unit battery cells Cell1 to CellM; R1 represents a resistance on the side of the system board 2, the resistance including the parasitic resistance Rsys; and R2 represents a resistance on the side of the battery pack 1, the resistance including the parasitic resistance Rbat and the on-resistance of the discharge control transistor MND. Note that a voltage drop due to the body diode DMC of the charge control transistor MNC is ignored in FIG. 5.

As shown in FIG. 5, when electric power is supplied to the internal circuit 20 from the assembled battery 11, the discharge current Id flows from the positive-side electrode (node ND2) of the assembled battery 11 to the high-potential-side power supply terminal (node ND1) of the internal circuit 20. At this time, a power supply voltage Vsys (voltage at the node ND1) applied to the internal circuit 20 can be expressed by Expression (1).

$$Vsys = VCELL - Id(R1 + R2 + RCELL4) \quad (1)$$

Further, since the power supply voltage Vsys applied to the internal circuit 20 is not less than the minimum operating voltage Vmin that ensures the operation of the internal circuit 20, Expression (2) holds.

$$Vmin \le Vsys \quad (2)$$
$$Id \le \frac{VCELL - Vmin}{R1 + R2 + RCELL}$$

Based on Expression (2), the maximum current Imax that can be supplied to the internal circuit 20 from the assembled battery 11 within the range in which the power supply voltage Vsys applied to the internal circuit 20 is not less than the minimum operating voltage Vmin can be expressed as Expression (3).

$$Imax = \frac{VCELL - Vmin}{R1 + R2 + RCELL} \quad (3)$$

Further, the total cell voltage VCELL can be expressed as Expression (4). Note that Va represents the value of the output voltage Vbat of the assembled battery 11 in the normal clock operation mode, and Ia represents the value of the discharge current Id of the assembled battery 11 in the normal clock operation mode.

$$VCELL = Va - RCELL \times Ia \quad (4)$$

The maximum current Imax can be expressed as Expression (5) by substituting Expression (4) into Expression (3).

$$Imax = \frac{(Va - RCELL \times Ia) - Vmin}{R1 + R2 + RCELL} \quad (5)$$

Accordingly, the maximum power amount Pmax, which is the amount of maximum power that can be output to the internal circuit 20 from the assembled battery 11 in the high-speed clock operation mode, can be expressed as Expression (6).

$$Pmax = Vmin \times Imax \quad (6)$$
$$= Vmin \times \frac{(Va - RCELL \times Ia) - Vmin}{R1 + R2 + RCELL}$$

Assuming herein that the value of the output voltage Vbat of the assembled battery 11 in the high-speed clock operation mode is represented by Vb and the value of the discharge current Id in the high-speed clock operation mode is represented by Ib, the internal resistance RCELL of the assembled battery 11 can be expressed as Expression (7).

$$RCELL = \frac{|Va - Vb|}{|Ia - Ib|} \quad (7)$$

As is clear from Expression (7), the battery control IC 10 can estimate the internal resistance RCELL of the assembled battery 11 by measuring the output voltage value Va and the discharge current value Ia of the assembled battery 11 in the normal clock operation mode and the output voltage value Vb and the discharge current value Ib of the assembled battery 11 in the high-speed clock operation mode. The battery control IC 10 can calculate the maximum power amount Pmax by substituting the estimated internal resistance RCELL into Expression (6).

(Method for Correcting the Maximum Power Amount Pmax)

Next, the method for correcting the maximum power amount Pmax will be described in detail.

First, assuming that the discharge current value Ib is the maximum current Imax, the theoretical value Va_set of the output voltage value Va in the normal clock operation mode is calculated from Expression (7). Note that Vb=Vmin holds when Ib=Imax. The theoretical value Va_set of the output voltage value Va can be expressed as the following Expression (8).

$$Va\_set = Ib(R1 + R2 + RCELL) + Ia \cdot RCELL + Vmin \quad (8)$$

However, when the above-mentioned various parameters stored in the register unit 102 are different from the actual values, the output voltage value Vb has an error corresponding to ΔV (Vb=Vmin+ΔV). At this time, the relationship between the theoretical value Va_set and the actual value Va_real of the output voltage value Va can be expressed as the following Expression (9).

$$Va - Vb = Va\_set - Vmin \quad (9)$$
$$= Va\_real - (Vmin + \Delta V)$$

In Expression (9), when the output voltage value Vb is replaced by the voltage Vf1 which has dropped from the output voltage value Vb by the amount corresponding to the on-resistances of the transistors MND and MNC, the relationship in the following Expression (10) holds. Note that ΔV=Vf1−Vmin holds and the voltage Vf1 is measured in the high-speed clock operation mode.

$$Va - Vf1 = Va\_set - Vf1 \quad (10)$$
$$= Va\_real - (Vf1 + \Delta V)$$

Based on Expression (10), the actual value Va_real of the output voltage value Va can be expressed as Expression (11).

$$Va\_real = Va\_set + \Delta V \quad (11)$$

A corrected value Imax_real of the maximum current Imax can be expressed as Expression (12) by substituting Expression (11) into Expression (5).

$$Imax\_real = \frac{(Va\_real - RCELL \times Ia) - Vmin}{R1 + R2 + RCELL} \quad (12)$$
$$= \frac{(Va\_set + \Delta V - RCELL \times Ia) - Vmin}{R1 + R2 + RCELL}$$

A corrected value Pmax_real of the maximum power amount Pmax can be expressed as Expression (13) by substituting Expression (12) into Expression (6). This corrected value Pmax_real is treated as the formal maximum power amount Pmax.

$$Pmax\_real = Vmin \times Imax\_real \quad (13)$$
$$= Vmin \times \frac{(Va\_set + \Delta V - RCELL \times Ia) - Vmin}{R1 + R2 + RCELL}$$

In this manner, the battery control IC 10 can correct the maximum power amount Pmax according to a change in the on-resistances of the transistors MND and MNC which are dominant resistant components among the resistance components on the power supply path. In other words, the battery control IC 10 can calculate the maximum power amount Pmax with a high accuracy.

If the above-described correction of the maximum power amount Pmax is not carried out, the following problems may occur. For example, when the battery control IC calculates the maximum power amount Pmax greater than the actual value, the power supply voltage Vsys applied to the internal circuit in the actual operation is lower than the minimum operating voltage Vmin, which makes it impossible for the internal circuit to operate. On the other hand, when the battery control IC calculates the maximum power amount Pmax smaller than the actual value, the power supply voltage Vsys applied to the internal circuit in the actual operation is higher than the minimum operating voltage Vmin, which forces the internal circuit to operate with a decreased performance. In contrast, the battery control IC 10 according to the first embodiment can solve these problems.

(Flow of Calculation Process of the Maximum Power Amount Pmax)

Figure 6:
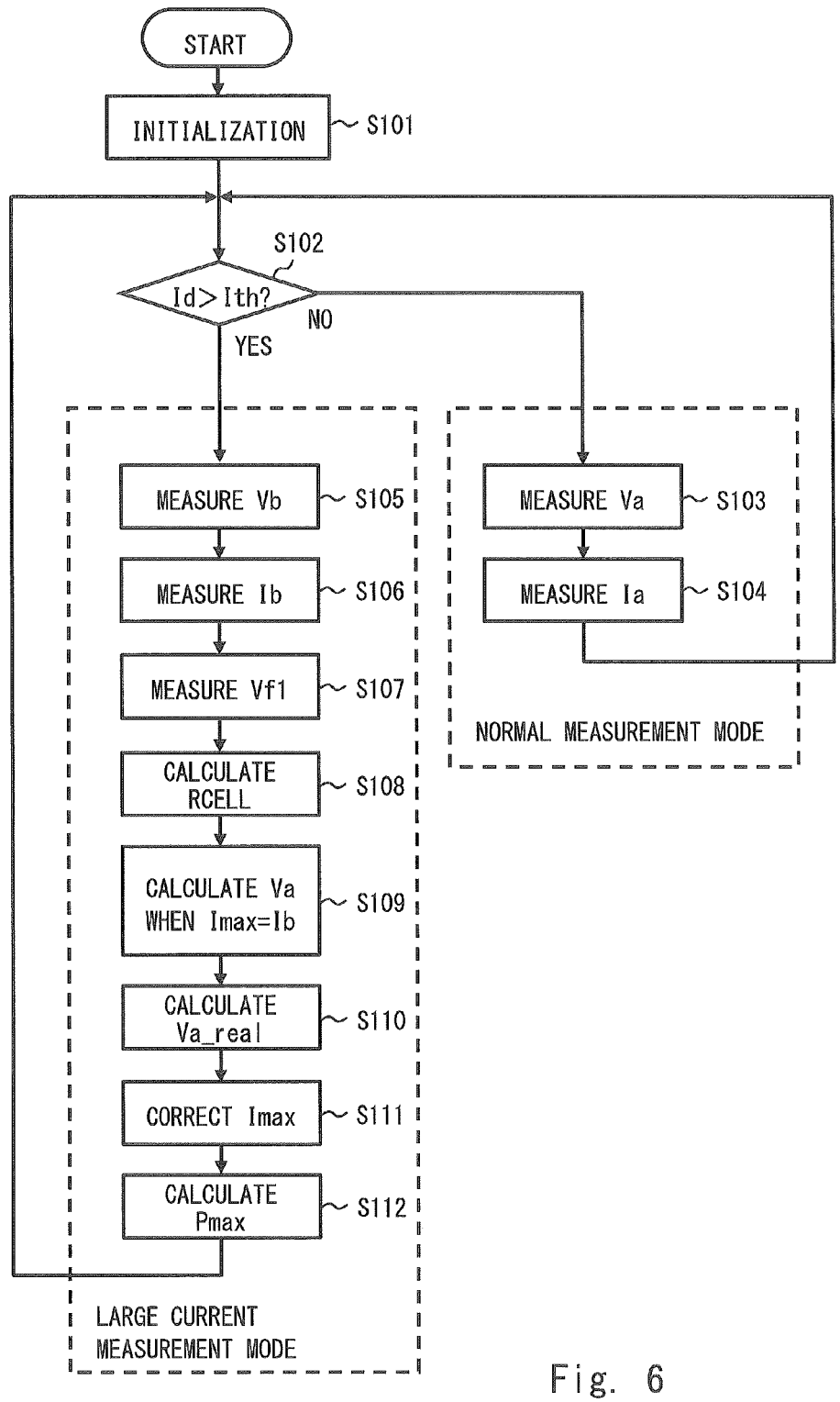
FIG. 6 is a flowchart showing a flow of a calculation process of the maximum power amount Pmax by the battery control IC according to the first embodiment.
Figure 7:
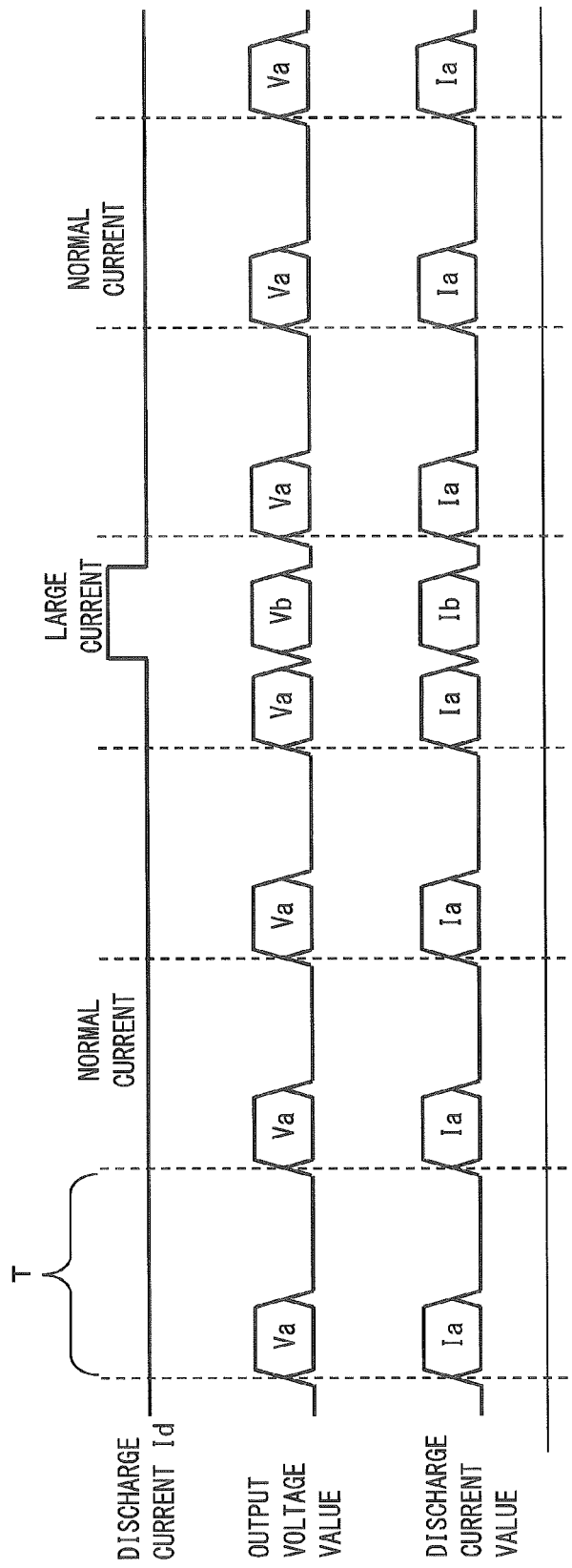
FIG. 7 is a timing chart showing an operation of the battery control IC according to the first embodiment.

Referring next to FIGS. 6 and 7, the flow of the calculation process of the maximum power amount Pmax by the battery control IC 10 will be described. FIG. 6 is a flowchart showing the flow of the calculation process of the maximum power amount Pmax by the battery control IC 10. FIG. 7 is a timing chart showing the operation of the battery control IC 10.

When the power-on reset is released, for example, the battery control IC 10 starts the process for calculation of the maximum power amount Pmax.

First, the battery control IC 10 is initialized (step S101). Specifically, the battery control IC 10 stores, in the register unit 102, various parameters such as the resistance value of the sense resistor Rs, the resistance values of the parasitic resistances Rsys and Rbat, the on-resistances of the charge control transistor MNC and the discharge control transistor MND, the forward voltages of the body diodes DMC and DMD, and the minimum operating voltage Vmin. For example, these parameters are supplied to the battery control IC 10 from the internal circuit 20. After the initialization, the battery control IC 10 sets the current measurement unit 104 and the voltage measurement unit 106 to an enable state, to thereby start the measurement of the charge and discharge currents and battery voltage of the assembled battery 11 and start monitoring the state of the assembled battery 11.

Next, the battery control IC 10 determines the operation mode of the CPU 22 (step S102). For example, when the discharge current Id of the assembled battery 11 is equal to or less than the threshold current Ith (No in step S102), the battery control IC 10 determines that the operation mode of the CPU 22 is the normal clock operation mode. When the discharge current Id of the assembled battery 11 exceeds the threshold current Ith (Yes in step S102), the battery control IC 10 determines, that the operation mode of the CPU 22 is the high-speed clock operation mode.

First, when the discharge current Id of the assembled battery 11 is equal to or less than the threshold current Ith (No in step S102), the battery control IC 10 determines that the operation mode of the CPU 22 is the normal clock operation mode, and shifts a measurement mode to a normal measurement mode.

In the normal measurement mode, the voltage measurement unit 106 measures the output voltage Vbat of the assembled battery 11 (step S103). Further, the current measurement unit 104 measures the discharge current Id of the assembled battery 11 (step S104). The value of the output voltage Vbat measured by the voltage measurement unit 106 is stored in the register unit 102 as the output voltage value Va. The value of the discharge current Id measured by the current measurement unit 104 is stored in the register unit 102 as the discharge current value Ia. After that, the process returns to the operation mode determination process by the CPU 22 (step S102). The measurement of the output voltage Vbat and the discharge current Id in the normal measurement mode is repeatedly executed in, for example, a period T, until the discharge current Id exceeds the threshold current Ith.

Next, when the discharge current Id of the assembled battery 11 has exceeded the threshold current Ith (Yes in step S102), the battery control IC 10 determines that the operation mode of the CPU 22 is the high-speed clock operation mode, and shifts the measurement mode to a large current measurement mode.

In the large current measurement mode, the output voltage Vbat of the assembled battery 1 is measured by the voltage measurement unit 106 (step S105). Further, the discharge current Id of the assembled battery 11 is measured by the current measurement unit 104 (step S106). Furthermore, the voltage Vf1 at the node ND3 on the power supply path is measured by the voltage measurement unit 106 (step S107). The value of the output voltage Vbat measured by the voltage measurement unit 106 is stored in the register unit 102 as the output voltage value Vb. The value of the discharge current Id measured by the current measurement unit 104 is stored in the register unit 102 as the discharge current value Ib. Similarly, the voltage Vf1 measured by the voltage measurement unit 106 is stored in the register unit 102.

Next, the battery control IC 10 estimates the internal resistance RCELL of the assembled battery 11 by substituting, into Expression (7), the output voltage value Va and the discharge current value Ia which are measured in the normal measurement mode and the output voltage value Vb and the discharge current value Ib which are measured in the large current measurement mode (step S108).

Next, the battery control IC 10 calculates the theoretical value Va_set of the output voltage value Va, which is obtained when Imax=Ib, by using Expression (8) (step S109).

Next, the battery control IC 10 calculates the actual value Va_real of the output voltage value Va by substituting, into Expression (11), the theoretical value Va_set of the output voltage value Va and the voltage Vf1 at the node ND3 measured in the large current measurement mode (step S110).

Next, the battery control IC 10 calculates the corrected value Imax_real of the maximum current Imax by substituting the actual value Va_real of the output voltage value Va into Expression (12) (step S111).

Next, the battery control IC 10 calculates the corrected value Pmax_real of the maximum power amount Pmax by substituting the corrected value Imax_real into Expression (13) (step S112). This corrected value Pmax_real is treated as the formal maximum power amount Pmax. After that, the process returns to the process of comparing the magnitude of the discharge current Id with the magnitude of the threshold current Ith (step S102).

In this manner, the battery control IC 10 according to the first embodiment calculates the theoretical value Va_set of the output voltage value Va assuming that the discharge current value Ib is the maximum current Imax, calculates the actual value Va_real of the output voltage value Va based on the theoretical value Va_set and the voltage Vf 1 on the power supply path, and corrects the maximum power amount Pmax based on the actual value Va_real. With this configuration, the battery control IC 10 according to the first embodiment can calculate the maximum power amount Pmax with a high accuracy even when the on-resistances of the transistors MND and MNC, which are dominant resistance components among the resistance components on the power supply path, vary.

Further, the battery control IC 10 according to the first embodiment includes the current detection unit 105 that detects that the discharge current Id has exceeded the threshold current Ith. This makes it possible to rapidly detect that the operation mode of the CPU 22 has shifted from the normal clock operation mode to the high-speed clock operation mode. Accordingly, the battery control IC 10 according to the first embodiment can complete the measurement of the output voltage value Vb and the discharge current value Ib of the assembled battery 11 even when the period of the high-speed clock operation mode is short. Consequently, the battery control IC 10 can calculate the maximum power amount Pmax with a high accuracy.

While the first embodiment illustrates an example in which the battery control IC 10 includes the current detection unit 105 that detects that the discharge current Id has exceeded the threshold current Ith, the configuration of the battery control IC 10 is not limited to this. For example, in the case where the operation mode of the CPU 22 is periodically switched, it is not necessary to detect that the discharge current Id has exceeded the threshold current Ith, and thus there is no need to provide the current detection unit 105.

<Second Embodiment>

Figure 8:
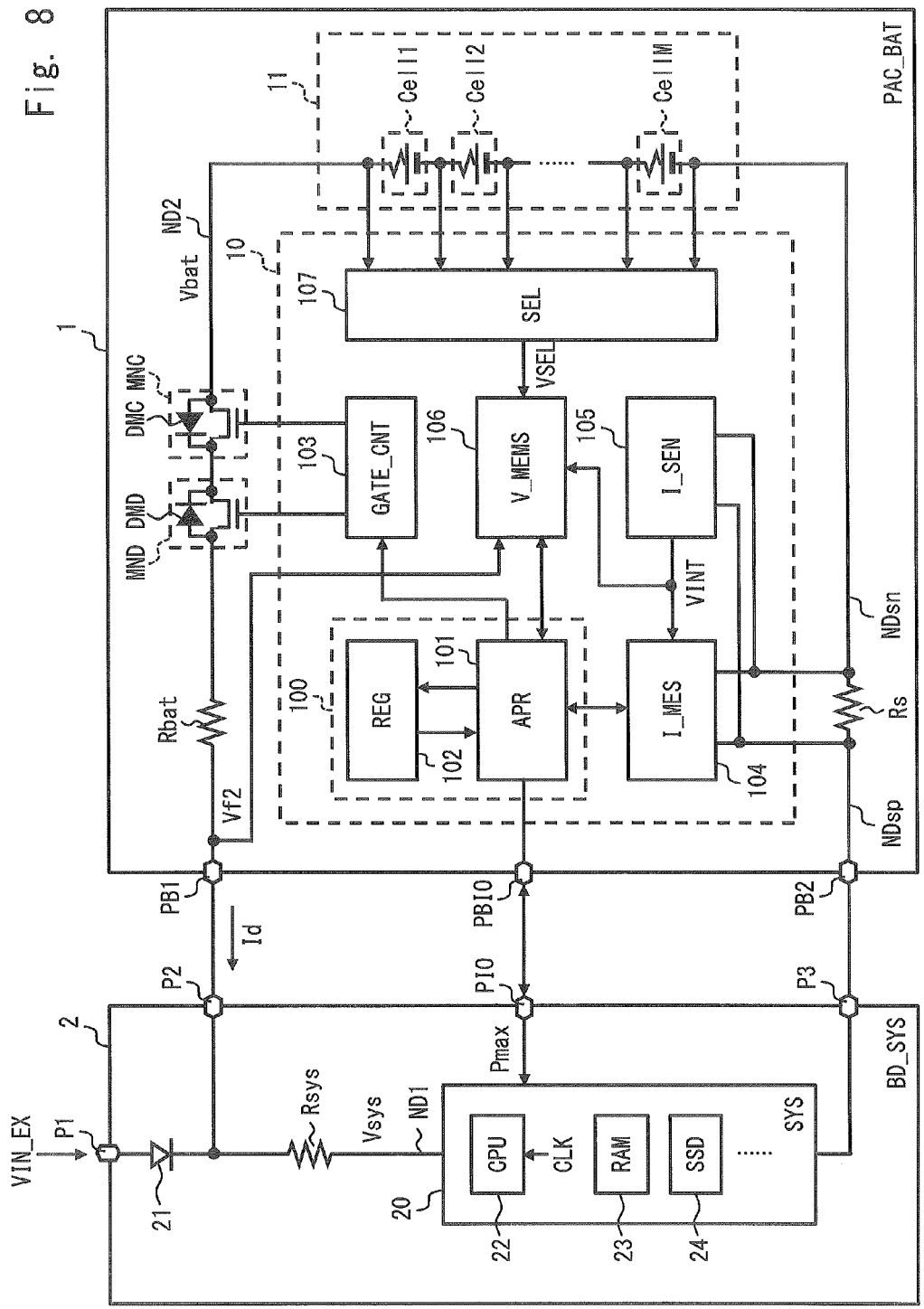
FIG. 8 is a block diagram showing a mobile terminal equipped with a battery pack including a battery control IC according to a second embodiment.
Figure 9:
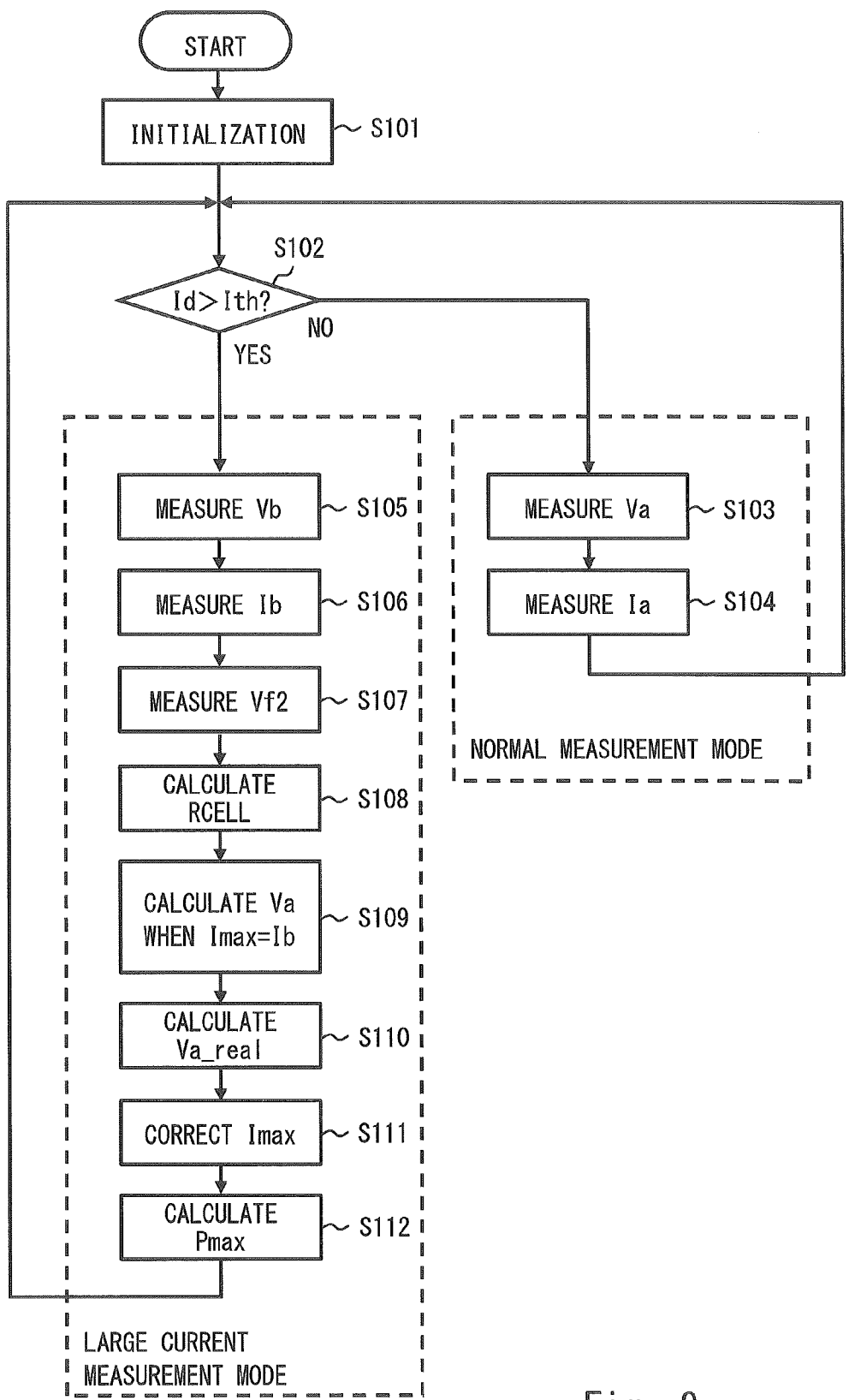
FIG. 9 is a flowchart showing a flow of a calculation process of the maximum power amount Pmax by the battery control IC according to the second embodiment.

FIG. 8 is a block diagram showing a mobile terminal equipped with a battery pack including a battery control IC according to a second embodiment. FIG. 9 is a flowchart showing a flow of a calculation process of the maximum power amount Pmax by the battery control IC according to the second embodiment.

In the battery control IC 10 according to the second embodiment, the voltage measurement unit 106 measures a voltage Vf2 of the high-potential-side power supply terminal PB1, instead of the voltage (output voltage of each of the transistors MND and MNC) Vf1 at the node ND3. The other components of the battery control IC 10 according to the second embodiment are similar to those of the battery control IC 10 according to the first embodiment, and thus the description thereof is omitted.

In Expression (9), when the output voltage value Vb is replaced by the voltage Vf2 which has dropped from the output voltage value Vb by the amount corresponding to the on-resistances of the transistors MND and MNC and the parasitic resistance Rbat, the relationship in the following Expression (14) holds. Note that $\Delta V = Vf2 - Vmin$ holds and the voltage Vf2 is measured in the high-speed clock operation mode.

$$Va - Vf2 = Va\_set - Vf2 \quad (14)$$
$$= Va\_real - (Vf2 + \Delta V)$$

The battery control IC 10 according to the second embodiment calculates the corrected value Pmax_real of the maximum power amount Pmax based on Expressions (11) to (14). This corrected value Pmax_real is treated as the formal maximum power amount Pmax.

In this manner, the battery control IC 10 according to the second embodiment calculates the theoretical value Va_set of the output voltage value Va assuming that the discharge current value Ib is the maximum current Imax, calculates the actual value Va_real of the output voltage value Va based on the theoretical value Va_set and the voltage Vf2 on the power supply path, and corrects the maximum power amount Pmax based on the actual value Va_real. With this configuration, the battery control IC 10 according to the second embodiment can calculate the maximum power amount Pmax with a high accuracy even when the on-resistances of the transistors MND and MNC and the parasitic resistance Rbat, which are dominant resistance components among the resistance components on the power supply path, vary.

<Third Embodiment>

Figure 10:
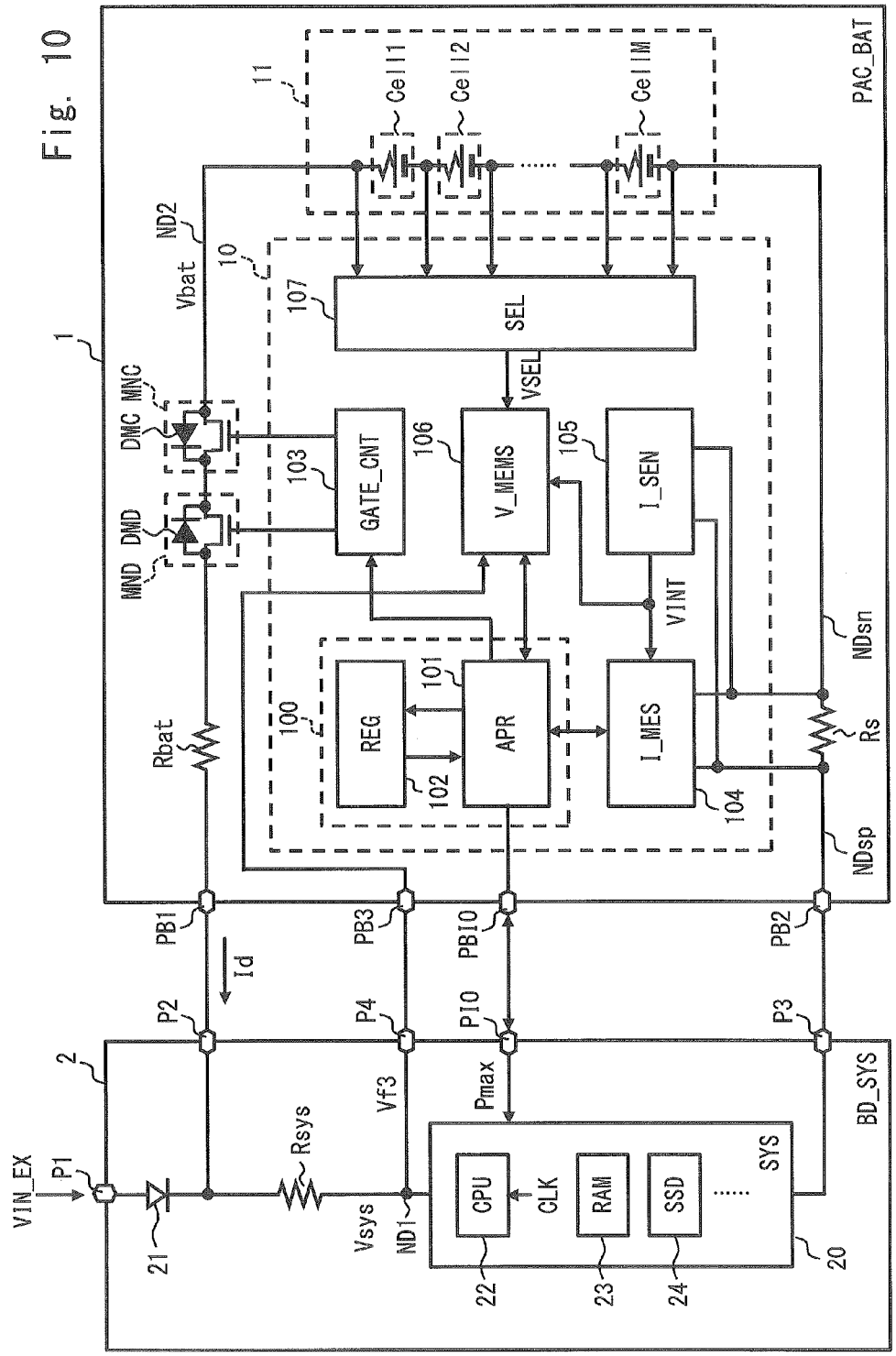
FIG. 10 is a block diagram showing a mobile terminal equipped with a battery pack including a battery control IC according to a third embodiment.
Figure 11:
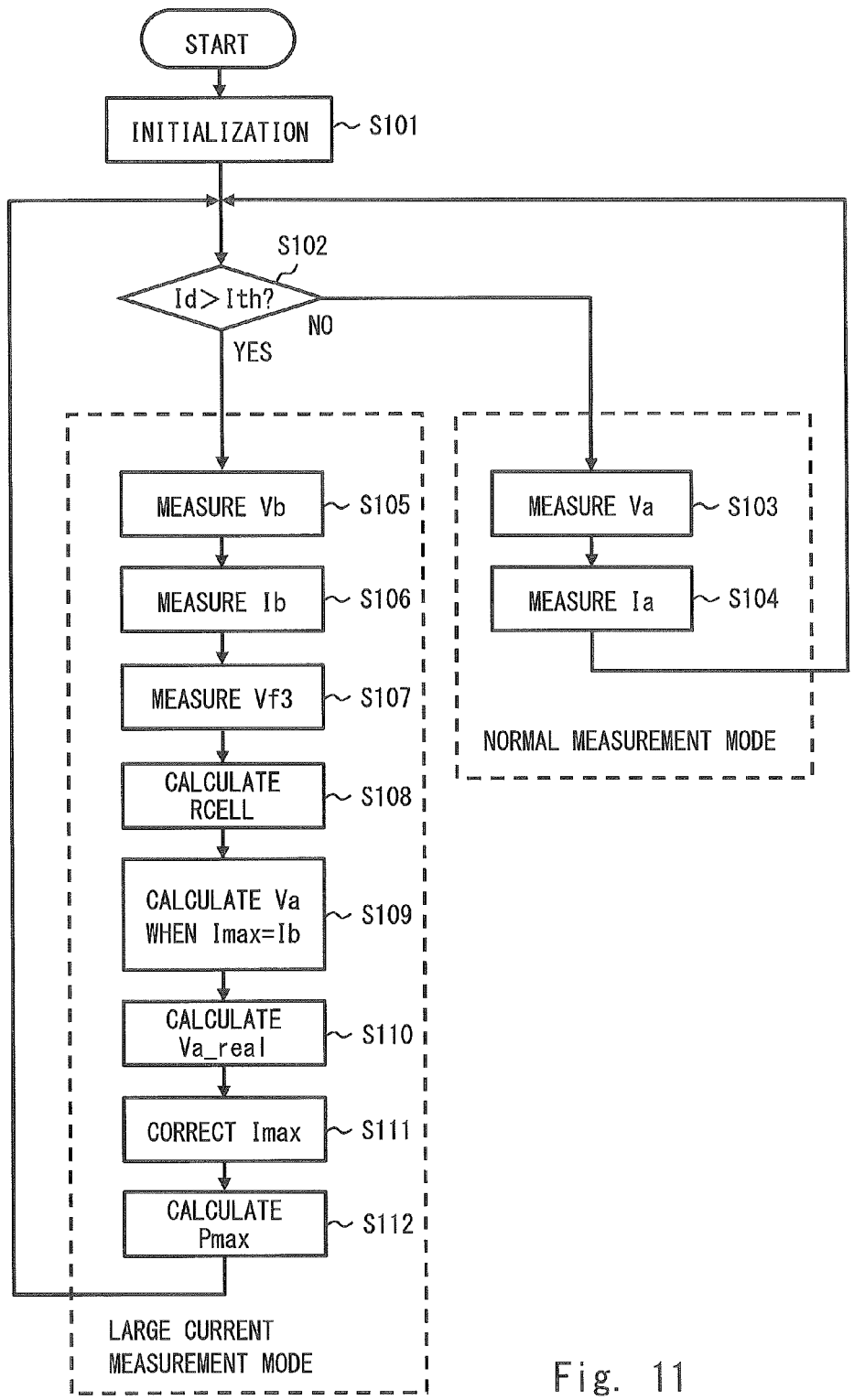
FIG. 11 is a flowchart showing a flow of a calculation process of the maximum power amount Pmax by the battery control IC according to the third embodiment.

FIG. 10 is a block diagram showing a mobile terminal equipped with a battery pack including a battery control IC according to a third embodiment. FIG. 11 is a flowchart showing a flow of a calculation process of the maximum power amount Pmax by the battery control IC according to the third embodiment.

In the battery control IC 10 according to the third embodiment, the voltage measurement unit 106 measures a voltage Vf3 (=Vsys) at the high-potential-side power supply terminal (node ND1) of the internal circuit 20, instead of the voltage (output voltage of each of the transistors MND and MNC) Vf1 at the node ND3. The other components of the battery control IC 10 according to the third embodiment are similar to those of the battery control IC 10 according to the first embodiment, and thus the description thereof is omitted.

In Expression (9), when the output voltage value Vb is replaced by the voltage Vf3 which has dropped from the output voltage value Vb by the amount corresponding to the on-resistances of the transistors MND and MNC and the parasitic resistances Rbat and Rsys, the relationship in the following Expression (15) holds. Note that $\Delta V = Vf3 - Vmin$ holds and the voltage Vf3 is measured in the high-speed clock operation mode.

$$Va - Vf3 = Va\_set - Vf3 \quad (15)$$
$$= Va\_real - (Vf3 + \Delta V)$$

The battery control IC 10 according to the third embodiment calculates the corrected value Pmax_real of the maximum power amount Pmax based on Expressions (11) to (13) and Expression (15). This corrected value Pmax_real is treated as the formal maximum power amount Pmax.

In this manner, the battery control IC 10 according to the third embodiment calculates the theoretical value Va_set of the output voltage value Va assuming that the discharge current value Ib is the maximum current Imax, calculates the actual value Va_real of the output voltage value Va based on the theoretical value Va_set and the voltage Vf3 on the power supply path, and corrects the maximum power amount Pmax based on the actual value Va_real. With this configuration, the battery control IC 10 according to the third embodiment can calculate the maximum power amount Pmax with a high accuracy even when the resistance components on the power supply path (the on-resistances of the transistors MND and MNC, the parasitic resistance Rbat, and the parasitic resistance Rsys) vary.

As described above, the battery control IC 10 according to the first to third embodiments calculates the theoretical value Va_set of the output voltage value Va assuming that the discharge current value Ib is the maximum current Imax, calculates the actual value Va_real of the output voltage value Va based on the theoretical value Va_set and the voltage (Vf1, Vf2, or Vf3) on the power supply path, and corrects the maximum power amount Pmax based on the actual value Va_real. With this configuration, the battery control IC 10 according to the first to third embodiments can calculate the maximum power amount Pmax with a high accuracy even when the resistance components on the power supply path vary.

The present invention made by the present inventor has been described above in a specific manner with reference to embodiments. However, the present invention is not limited to the above-described embodiments, and needless to say, various modifications can be made without departing from the spirit and scope of the present invention.

For example, in the semiconductor device according to the embodiments described above, the conductivity type (p-type or n-type) of the semiconductor substrate, semiconductor layers, diffusion layers (diffusion regions), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising
a voltage measurement unit that measures an output voltage of a battery and a voltage on a power supply path between the battery and an internal circuit supplied with electric power from the battery;
a current measurement unit that measures a discharge current of the battery; and
a processor, executing program instructions stored in a non-transitory computer readable medium, that calculates a theoretical value of the output voltage in a normal measurement mode assuming that the discharge current measured in a large current measurement mode is a maximum available current of the battery in the large current measurement mode, and calculates an amount of maximum available power of the battery in the large current measurement mode based on the calculated theoretical value of the output voltage and the voltage on the power supply path measured in the large current measurement mode,
wherein the theoretical value of the output voltage is calculated according to an internal resistance of the battery, and a resistance on a side including the voltage measurement unit, current measurement unit, and the processor.

2. The semiconductor device according to claim 1, wherein the processor calculates an actual value of the output voltage in the normal measurement mode based on the calculated theoretical value of the output voltage and the voltage on the power supply path measured in the large current measurement mode, and calculates an amount of maximum available power of the battery in the large current measurement mode based on the calculated actual value of the output voltage.

3. The semiconductor device according to claim 1, further comprising a transistor that is provided on the power supply path and controls whether or not to supply the electric power of the battery to the internal circuit,
wherein the voltage measurement unit measures an output voltage of the transistor as a voltage on the power supply path.

4. The semiconductor device according to claim 1, wherein the voltage measurement unit measures, as a voltage on the power supply path, a voltage at an external terminal of the semiconductor device, the external terminal being provided on the power supply path.

5. The semiconductor device according to claim 1, wherein the voltage measurement unit measures, as a voltage on the power supply path, a voltage applied to the internal circuit.

6. The semiconductor device according to claim 1, wherein when the discharge current is equal to or less than a threshold current, the processor sets the normal measurement mode as a measurement mode, and when the discharge current exceeds the threshold current, the processor sets the large current measurement mode as the measurement mode.

7. A battery pack comprising:
the semiconductor device; and
the battery,
the semiconductor device comprising:
a voltage measurement unit that measures an output voltage of a battery and a voltage on a power supply path between the battery and an internal circuit supplied with electric power from the battery;
a current measurement unit that measures a discharge current of the battery; and
a processor, executing program instructions stored in a non-transitory computer readable medium, that calculates a theoretical value of the output voltage in a normal measurement mode assuming that the discharge current measured in a large current measurement mode is a maximum available current of the battery the large current measurement mode, and calculates an amount of maximum available power of the battery in the large current measurement mode based on the calculated theoretical value of the output voltage and the voltage on the power supply path measured in the large current measurement mode,
wherein the theoretical value of the output voltage is calculated according to an internal resistance of the battery, and a resistance on a side including the voltage measurement unit, current measurement unit, and the processor.

8. A mobile terminal comprising;
a battery pack including a semiconductor device and a battery; and
the internal circuit driven by electric power supplied from the battery,
the semiconductor device comprising:
a voltage measurement unit that measures an output voltage of the battery and a voltage on a power supply path between the battery and an internal circuit supplied with electric power from the battery;
a current measurement unit that measures a discharge current of the battery; and
a processor, executing program instructions stored in a non-transitory computer readable medium, that calculates a theoretical value of the output voltage in a normal measurement mode assuming that the discharge current measured in a large current measurement mode is a maximum available current of the battery in the large current measurement mode, and calculates an amount of maximum available power of the battery in the large current measurement mode based on the calculated theoretical value of the output voltage and the voltage on the power supply path measured in the large current measurement mode, wherein the theoretical value of the output voltage is calculated according to an internal resistance of the battery, and resistance on a side including the voltage measurement unit, current measurement unit, and the processor.

9. The battery pack according to claim 7, wherein the processor calculates an actual value of the output voltage in the normal measurement mode based on the calculated theoretical value of the output voltage and the voltage on the power supply path measured in the large current measurement mode, and calculates an amount of maximum available power of the battery in the large current measurement mode based on the calculated actual value of the output voltage.

10. The battery pack according to claim 7, further comprising a transistor that is provided on the power supply path and controls whether or not to supply the electric power of the battery to the internal circuit, wherein the voltage measurement unit measures an output voltage of the transistor as a voltage on the power supply path.

11. The battery pack according to claim 1, wherein the voltage measurement unit measures, as a voltage on the power supply path, a voltage at an external terminal of the semiconductor device, the external terminal being provided on the power supply path.

12. The battery pack according to according to claim 1, wherein the voltage measurement unit measures, as a voltage on the power supply path, a voltage applied to the internal circuit.

13. The battery pack according to claim 1, wherein when the discharge current is equal to or less than a threshold current, the processor sets the normal measurement mode as a measurement mode, and when the discharge current exceeds the threshold current, the processor sets the large current measurement mode as the measurement mode.

14. The mobile terminal according to claim 8, wherein the processor calculates an actual value of the output voltage in the normal measurement mode based on the calculated theoretical value of the output voltage and the voltage on the power supply path measured in the large current measurement mode, and calculates an amount of maximum available power of the battery in the large current measurement mode based on the calculated actual value of the output voltage.

15. The mobile terminal according to claim 8, further comprising a transistor that is provided on the power supply path and controls whether or not to supply the electric power of the battery to the internal circuit, wherein the voltage measurement unit measures an output voltage of the transistor as a voltage on the power supply path.

16. The mobile terminal according to claim 8, wherein the voltage measurement unit measures, as a voltage on the power supply path, a voltage at an external terminal of the semiconductor device, the external terminal being provided on the power supply path.

17. The mobile terminal according to claim 8, wherein the voltage measurement unit measures, as a voltage on the power supply path, a voltage applied to the internal circuit.

18. The mobile terminal according to claim 8, wherein when the discharge current is equal to or less than a threshold current, the processor sets the normal measurement mode as a measurement mode, and when the discharge current exceeds the threshold current, the processor sets the large current measurement mode as the measurement mode.

* * * * *